(12) United States Patent
Vandenberghe et al.

(10) Patent No.: US 9,177,680 B2
(45) Date of Patent: Nov. 3, 2015

(54) METHODS AND SYSTEMS FOR COLLIMATING

(75) Inventors: Stefaan Vandenberghe, Balegem (BE); Steven Staelens, Merelbeke (BE); Karel Deprez, Ghent (BE)

(73) Assignee: UNIVERSITEIT GENT, Ghent (BE)

( * ) Notice: Subject to any disclaimer, the term of this patent is extended or adjusted under 35 U.S.C. 154(b) by 544 days.

(21) Appl. No.: 13/514,698

(22) PCT Filed: Dec. 9, 2010

(86) PCT No.: PCT/EP2010/069303
§ 371 (c)(1),
(2), (4) Date: Jun. 8, 2012

(87) PCT Pub. No.: WO2011/070123
PCT Pub. Date: Jun. 16, 2011

(65) Prior Publication Data
US 2012/0267530 A1   Oct. 25, 2012

Related U.S. Application Data

(60) Provisional application No. 61/285,031, filed on Dec. 9, 2009.

(30) Foreign Application Priority Data

Feb. 2, 2010  (EP) ..................................... 10152398

(51) Int. Cl.
*G21K 1/02* (2006.01)
*G06F 17/50* (2006.01)
(52) U.S. Cl.
CPC *G21K 1/02* (2013.01); *G06F 17/50* (2013.01); *G21K 1/025* (2013.01)
(58) Field of Classification Search
CPC ........... G21K 1/02; G21K 1/025; G06F 17/50

USPC ....................................................... 250/505.1
See application file for complete search history.

(56) References Cited

U.S. PATENT DOCUMENTS

| | | | | |
|---|---|---|---|---|
| 3,543,384 A | * | 12/1970 | Hansen | ............................. 82/47 |
| 3,936,646 A | * | 2/1976 | Jonker | .......................... 378/148 |
| 4,079,259 A | * | 3/1978 | Blum | ............................ 378/149 |
| 7,339,174 B1 | | 3/2008 | Hugg et al. | |
| 7,408,163 B2 | * | 8/2008 | Hefetz | ..................... 250/363.04 |

FOREIGN PATENT DOCUMENTS

| | | |
|---|---|---|
| EP | 2226812 A1 | 9/2010 |
| WO | 0038197 A1 | 6/2000 |
| WO | 02089660 A2 | 11/2002 |

OTHER PUBLICATIONS

Kimiaei, Shahrokh et al., Collimator Design for Improved Spatial Resolution in SPECT and Planar Scintigraphy, Journal of Nuclear Medicine Soc. Nul. Med. USA, vol. 37, No. 8, Aug. 1996, pp. 1417-1421, XP-002638983.

(Continued)

*Primary Examiner* — David Porta
*Assistant Examiner* — Mindy Vu
(74) *Attorney, Agent, or Firm* — Bacon & Thomas, PLLC

(57) ABSTRACT

A collimator (100) for collimating radiation includes collimator material (150) and at least one collimator hole (110) defined by the surrounding collimator material (150). The collimator hole (110) defines an aperture (112) and a bottom surface (132) through which radiation can leave the collimator (100). The volume of the collimator hole between the aperture (112) and the entrance opening and/or exit opening is shaped such that there is at least one cross-section of the hole between the aperture (112) and the entrance opening and/or exit opening, the cross-section being taken parallel with the aperture, such that the shape of the cross-section of the hole cannot be obtained through an affine transform of the shape of the aperture.

12 Claims, 15 Drawing Sheets

(56) References Cited

OTHER PUBLICATIONS

Nollet, Tom et al., Simulation of complex geometries in GATE, IEEE Nuclear Science Symposium Conference Record, Piscataway, NJ, USA, Oct. 2009, pp. 4190-4192, XP-0026215145.

International Search Report and Written Opinion for PCT/EP2010/069303, dated Jun. 10, 2011.
Partial European Search Report for EP 10152398, dated Mar. 31, 2010.

* cited by examiner

METHODS AND SYSTEMS FOR COLLIMATING

CROSS-REFERENCE TO RELATED APPLICATIONS

This application claims the benefit of U.S. provisional application 61/285,031 filed Dec. 9, 2009, which is incorporated herein by reference.

FIELD OF THE INVENTION

The invention relates to the field of radiation-related systems. More particularly, the present invention relates to collimators for use in radiation-related systems, to methods for collimating and to systems using such collimators.

BACKGROUND OF THE INVENTION

An important part of a SPECT scanner is the collimator. The collimator is used to only transmit gamma rays with certain directions. Behind this collimator is a detector that converts the gamma ray in a measurable signal. Two main types of collimators are known, being the parallel hole collimator and the pinhole collimator. Pinhole collimators are used to select gamma rays from a cone. A pinhole is made out of 2 cones, the top cone is determined by the top of the collimator plate and the aperture and the bottom cone is determined by the aperture and the bottom of the plate. The projection of a pinhole collimator on a flat detector is a circular or elliptical region. Typically, a tradeoff has to be made when using pinholes on rectangular detectors. In case of a single pinhole either detector space will not be irradiated or parts outside the detector will be irradiated. In case of multiple pinholes, the projections of the different pinholes will overlap, or some valuable detector area will not be used. Another solution is to use slats in combination with the collimator to separate the different projections. Such additional shielding typically may result in a significant increase in scattered photons, weight and cost of the system. There is room for improvement of the detection system and/or the collimator component thereof.

SUMMARY OF THE INVENTION

It is an object of embodiments of the present invention to provide good collimators and systems using such collimators as well as to provide good methods for collimating. It is an advantage of embodiments according to the present invention that a more efficient use can be made of the available detector surface positioned after the collimator, compared to e.g. conventional pinhole systems. It is an advantage of at least some embodiments that one or more of the problems mentioned in the background can be reduced or solved.

It is an advantage of embodiments according to the present invention that the available detection surface can be used as efficiently as possible, while minimizing the overlap, i.e. the detector area that is irradiated through different collimator holes or that would be irradiated through different collimator holes if no slats were used.

The above objective is accomplished by a method and device according to the present invention. The present invention relates to a collimator for collimating radiation, the collimator comprising collimator material and at least one collimator hole defined by the surrounding collimator material, the collimator hole defining an aperture and an entrance opening and exit opening through which radiation can enter respectively leave the collimator, whereby the volume of the collimator hole between the aperture and at least one of the entrance opening and/or exit opening is shaped such that there is at least one cross-section of the hole between the aperture and the entrance opening and/or the exit opening, the cross-section being taken parallel with the aperture, such that the shape of the cross-section of the hole is a non-affine transform of the shape of the aperture. The cross-section may be between the aperture and a bottom surface through which radiation can leave the collimator. The volume of the collimator hole between the aperture and the entrance or the exit opening may differ from a conical shape. The volume of the collimator hole between the aperture and the bottom surface may be limited by a circular-shaped surface area on one side, e.g. the aperture, and by a surface area comprising at least one corner at another side. The shape of the area of the entrance opening and/or exit opening defining the entrance area for receiving radiation or defining the exit area for radiation leaving the collimator hole may comprise at least one corner. It is an advantage of embodiments according to the present invention that the detector area or a predetermined and selected part of the detector area can be good or even optimally used. It is an advantage of embodiments according to the present invention that detector use can be obtained with high sensitivity for geometrical photons that have a line-of-flight from the aperture towards the detector and with low sensitivity for geometrical photons that have a line-of-flight from the aperture towards a point outside the detector area. Geometrical photons thereby are photons which do not penetrate collimator material.

The shape of the area of the entrance and/or exit opening, e.g. of the bottom surface defining the exit area for radiation leaving the collimator hole, may be polygonal. The shape of the entrance opening or exit opening, e.g. of the area of the bottom surface defining the exit area for radiation leaving the collimator hole, may be rectangular. The collimator may be adapted for operating with a detector having a non-circular shaped detection area, wherein the volume of the collimator hole between the aperture and the bottom surface may be determined taking into account the shape of a detection area and/or wherein the volume of the collimator hole between the aperture and the entrance opening is determined taking into account the shape of a detection area.

The collimator may comprise a plurality of collimator holes.

The collimator may comprise a plurality of collimator holes, whereby the different collimator holes are arranged for irradiating different areas of the detection surface, the different areas filling the detector high sensitivity surface overall for at least 80%, advantageously at least 90%, and the different areas overlapping with each other over at most 20%, advantageously at most 10%, of their total surface. The collimator may be embedded in a radiation detection system.

The present invention also relates to a method for designing or producing a collimator, the method comprising defining a collimator material, determining the detector area or part thereof that one wants to irradiate using the collimator to be provided, defining the aperture in this collimator material, drawing, for a plurality, advantageously all, points on the edges of the detector area to be irradiated, cones with as apexes a point on the edge of the detector area to be irradiated and with the edge of the aperture lying on the cones' lateral surfaces, selecting the top surface or the bottom surface of the collimator material as the surface to be used for constructing the collimator hole that will define the projection on the selected detector area, determining the shape of the entrance opening or exit opening to be provided in the collimator by intersection of the cones with the selected top surface or bottom surface. Alternatively, this can be formulated as a method for designing or producing a collimator, the method comprising defining a collimator material, e.g. collimator plate, comprising an aperture and a a bottom surface and/or top surface, e.g. a surface at the side of the collimator where radiation will be received or a surface at the side of the collimator where radiation will be detected, such as for example a bottom surface at a position where radiation will need to be coupled out from the collimator, determining the detector area or part thereof that one wants to irradiate with the collimator, drawing construction lines from all corners of this determined detector area towards the aperture and determining the shape of of the entrance opening or exit opening to be provided in the collimator by the intersection of these construction lines with the a bottom surface and/or top surface of the collimator material.

Selecting a degree of sensitivity may be performed by adapting the entrance/exit surface as function of the intersections of the cones with the selected top or bottom surface. Alternatively it may be formulated that drawing construction lines may comprise selecting a degree of sensitivity to be obtained at the determined detector area and selecting, based thereon, one or more predetermined points in the aperture for drawing the construction lines.

The method furthermore may comprise casting or machining the collimator based on the obtained shape of the entrance opening and/or exit opening of the collimator hole.

The method may be for designing or producing a collimator as described above.

The method may be implemented as a computer program product performing the designing or producing, when the method is executed on a computer.

The method may be implemented as a computer program product on a machine readable data storage device.

The present invention also relates to a radiation detection system, the radiation detection system comprising a detector comprising a detection surface and a collimator as described above.

The present invention also relates to the use of a method as described above for designing or producing a collimator as described above.

The present invention also relates to a computer program product for, when executed on a computer, performing a method for designing or producing as described above.

The present invention furthermore relates to a machine readable data storage device storing the computer program product as described above and/or to the transmission of such a computer program product over a local or wide area telecommunications network In some embodiments, the present invention relates to a collimator comprising at least one collimating region comprising an aperture, wherein the collimator region at at least one side of an aperture is different from a cone. The collimating region may be defined as the volume surrounded by collimator material through which radiation can pass the collimator. The aperture may be the smallest area confining the radiation going through the collimator.

In some embodiments according to the present invention, the outcoupling surface through which radiation leaves the collimating region of the surface may be polygonal such as for example rectangular or square in shape.

The collimator may be adapted for irradiating a predetermined detection surface and the outcoupling surface of the collimator may advantageously be adapted so that a larger detection surface is covered without increasing the overlap than would be obtained using a pinhole collimator Embodiments of the present invention also relate to a method for designing a collimator for a detection system. The present invention also relates to a system comprising a collimator as described above.

These and other aspects of the invention will be apparent from and elucidated with reference to the embodiment(s) described hereinafter.

SHORT DESCRIPTION OF THE DRAWINGS

FIG. 5 illustrates the detection area irradiated by a collimator according to FIG. 4a.

FIG. 7 illustrates the detection area irradiated by a collimator according to FIG. 6a.

FIG. 9 illustrates the detection area irradiated by a collimator according to FIG. 8a.

FIG. 11 illustrates the detection area irradiated by a collimator according to FIG. 10a.

Figure 1:
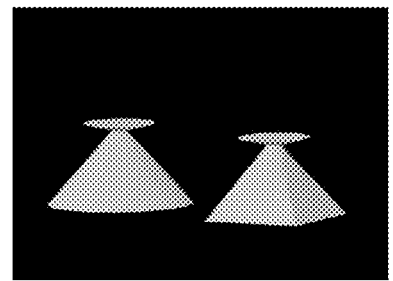
FIG. 1 illustrates an example of a pinhole collimator (left hand side) and an example of a collimator according to embodiments of the present invention (right hand side).

The drawings are only schematic and are non-limiting. In the drawings, the size of some of the elements may be exaggerated and not drawn on scale for illustrative purposes.

DETAILED DESCRIPTION OF ILLUSTRATIVE EMBODIMENTS

Where in embodiments according to the present invention reference is made to radiation, reference may be made to electromagnetic radiation comprising amongst others gamma radiation, embodiments of the present invention not being limited thereto. For example a collimator according to embodiments of the present invention also can collimate electro-magnetic waves such as for example infrared radiation, visible radiation, UV radiation, X-rays.

Where in embodiments according to the present invention reference is made to a shape of a cross-section of the hole being a non-affine transform of the shape of the aperture, there is meant that the shape of the cross-section of the hole cannot be obtained through an affine transformation of the shape of the aperture. An affine transformation thereby is a transformation that consists of a linear transformation followed by a translation.

In a first aspect, the present invention relates to a collimator. The collimator comprises at least one collimating region comprising an aperture, which can also be referred to as a hole in a collimator material, wherein the collimator region at at least one side of an aperture is different from a cone. According to embodiments of the present invention, the volume of the collimator hole between the aperture and the entrance opening and/or the exit opening is shaped such that there is at least one cross-section of the hole between the aperture and the entrance opening and/or exit opening, the cross-section being taken parallel with the plane through the aperture, such that the shape of the cross-section of the hole is a non-affine transform of the shape of the aperture. In an advantageous embodiment, a plurality of cross-sections are a non-affine transform of the shape of the aperture. In some embodiments, there exist no two cross-sections having shapes being affine transforms of each other between the aperture and the entrance and/or exit opening. The collimating region may for example be the volume surrounded by the collimator material and through which the radiation passes the collimator. The aperture may be the smallest area in the collimating region confining the radiation going through the collimator. The collimator region according to some embodiments of the present invention has an entrance opening or exit opening, e.g. an outcoupling surface through which radiation typically is coupled out from a collimator, which differs from a circle. The entrance opening or exit opening, e.g. outcoupling surface advantageously may be a polygonal, e.g. a rectangle, a square, a pentagonal shape, etc. In some embodiments, it typically may differ from a circle, elliptical or oval shape, as typically detection surfaces do not have such a shape. The shape of the entrance and/or exit opening, e.g. outcoupling surface, may be adapted so that the surface of the detector for which the collimator is used can be optimally used. The collimator according to embodiments of the present invention typically may be especially useful when using flat detection surfaces having a polygonal shape, e.g. a rectangular shape, or e.g. when using a curved detector surface, such as for example a cylindrical detector surface. The collimator may be a single hole collimator, whereby the outcoupling surface typically can be adapted to use the full detection surface, or may be a multiple hole collimator, whereby the outcoupling surface of one hole or preferably a multiple or all of the holes are adapted in shape so that a good, improved or optimum coverage of the detection surface is obtained by the projections, without increasing the overlap between the projections coming from different holes of the collimator.

The collimator may for example be made of tungsten, lead, platinum or gold or alloys of these materials embodiments of the present invention not being limited thereto. The size of the collimator is not limiting for embodiments of the present invention. An exemplary range of thicknesses of the collimator may be between 5 mm and 30 mm thick.

The collimator according to embodiments of the present invention, also referred to as lofthole collimator in the present application, may comprise at one side a cone determined by the walls of the through hole in the collimator material, e.g. collimator plate, and the aperture. Typically this may be at the receiving side where the collimator receives radiation for collimating, although embodiments of the present invention are not limited thereto. At another side the collimating region may have a volume that has the aperture as top and a base shape adapted so that the irradiation transmitted through the collimating region is covering the detection surface, at least in a better way than would be obtained when using conventional pinhole systems. The shape of the opening of the collimating region may be determined taking into account the detection surface, e.g. using a method as further described, although embodiments of the present invention are not limited thereto.

By way of illustration, the difference is shown in FIG. 1, showing at the left the negative image of a pinhole collimator and at the right the negative of an example of a collimator according to embodiments of the present invention. It can be seen that the pinhole collimator results in collimation of radiation to a circular or elliptical region, whereas the collimator according to an embodiment of the present invention results in collimation of radiation in a polygonal region.

Figure 2A:
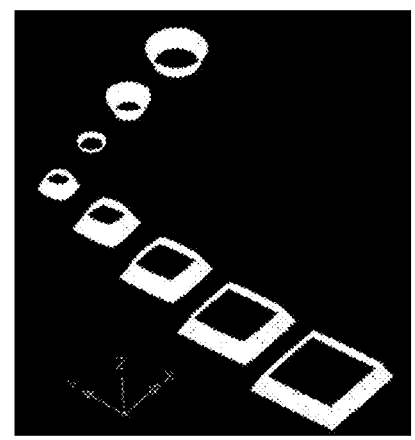
FIG. 2a illustrates different slices of a negative image of a collimator hole according to embodiments of the present invention, the slices being shifted with respect to each other to increase visibility of the collimator features.

By way of illustration, embodiments of the present invention not being limited thereto, a further illustration of an example of a lofthole collimator sliced and the slices being shifted from each other so as to make visible the change in shape is shown in FIG. 2a. It can be seen that whereas at one side of the aperture the collimator has a conical shape, at the other side of the aperture the collimator has a non-conical shape. The non-conical shape may be a complex volume that has the aperture as top and a geometric form different from a circle as exit or entrance surface. The geometric form at the exit or entrance surface can be used to shape the projection of irradiation on the detector using the collimator. The complex shape may incorporate a gentle transition from a circular or elliptical shape to a non-circular or non-elliptical shape, e.g. a substantially polygonal shape. With substantially polygonal shape there may be meant a shape comprising at least a plurality of corners or rounded corners, advantageously a plurality of corners. The substantially polygonal shape also may comprise a plurality of straight edges, although also curved edges may be present.

Figure 2B:
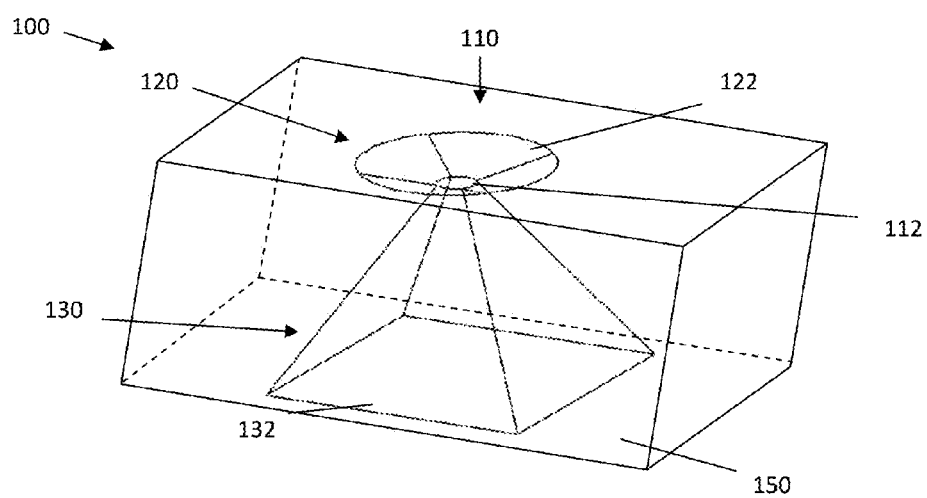
FIG. 2b illustrates a schematic illustration of a collimator according to an embodiment of the present invention.
Figure 2C:
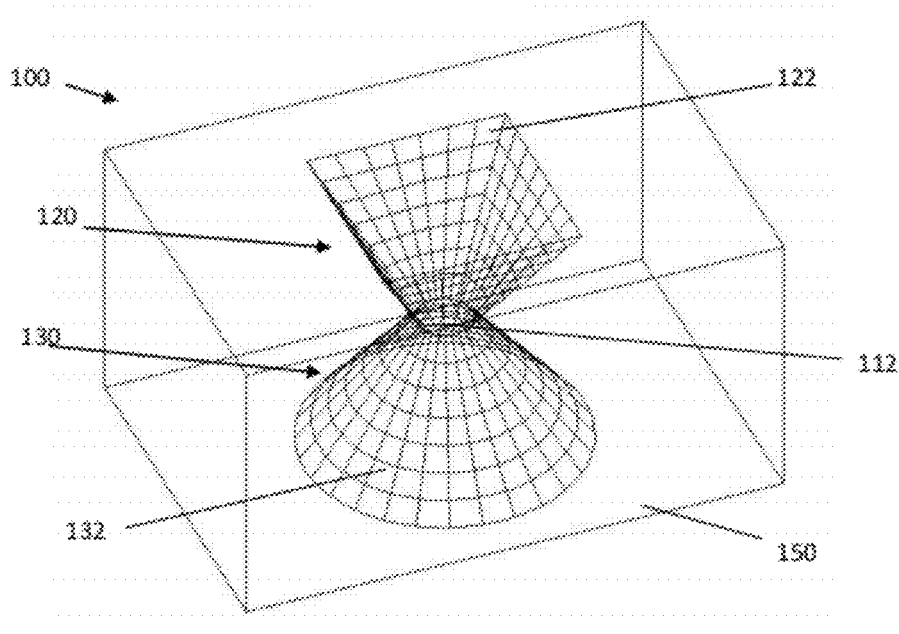
FIG. 2c and FIG. 2d illustrates two alternative embodiments of a collimator according to an embodiment of the present invention.
Figure 2D:
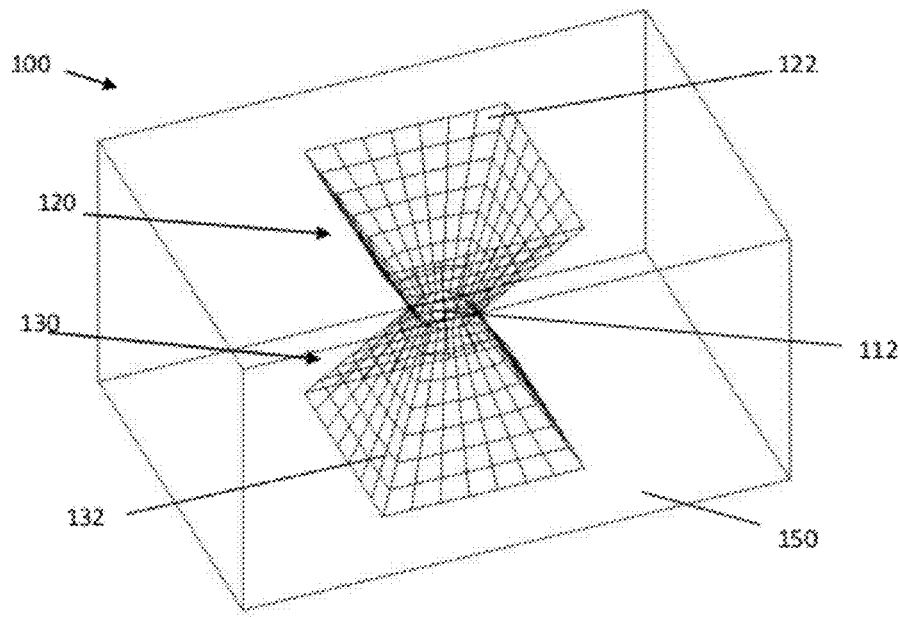

Collimators according to embodiments of the present invention comprise at least one collimator hole with a particular shape, the collimator hole being defined by the collimator material surrounding the collimator hole. In FIG. 2b a schematic drawing of a collimator hole, formed by surrounding collimator material, is shown. In the schematic drawing, the collimator hole 110 can be seen with the aperture 112, the top volume 120 positioned above the aperture where radiation to be collimated will travel before reaching the aperture in the present example being conical in shape and the bottom volume 130 being a volume different from a cone. The bottom volume thus is a more complex volume at the top side defined by the aperture 112 and at the bottom side defined by an exit surface 132. In the present example, the exit surface is rectangular. The top volume 120 is defined by an entrance surface 122 and the aperture 112. The surrounding collimator material 150 surrounding the collimator hole 110 of the collimator 100 also is indicated. Alternative collimator holes, are shown in FIG. 2c and FIG. 2d. In FIG. 2c, the bottom volume 130 has a conical shape and the top volume 120 has a more complex volume at the bottom side defined by the aperture 112 and at the top side defined by the entrance surface 122. In FIG. 2d, both the top volume 120 and the bottom volume 130 have a volume that is more complex than a conical shape. Further embodiments will be described wherein the collimator portion that is specially shaped is the portion between the aperture and the exit opening for the collimator, but it will be understood that the same features and advantages apply mutatis mutandis to collimators wherein the collimator portion that is specially shaped is the portion between the aperture and the entrance opening for the collimator. Furthermore, the present invention also relates to embodiments wherein both portions are specially shaped to have a good or optimized detector coverage.

Figure 3:
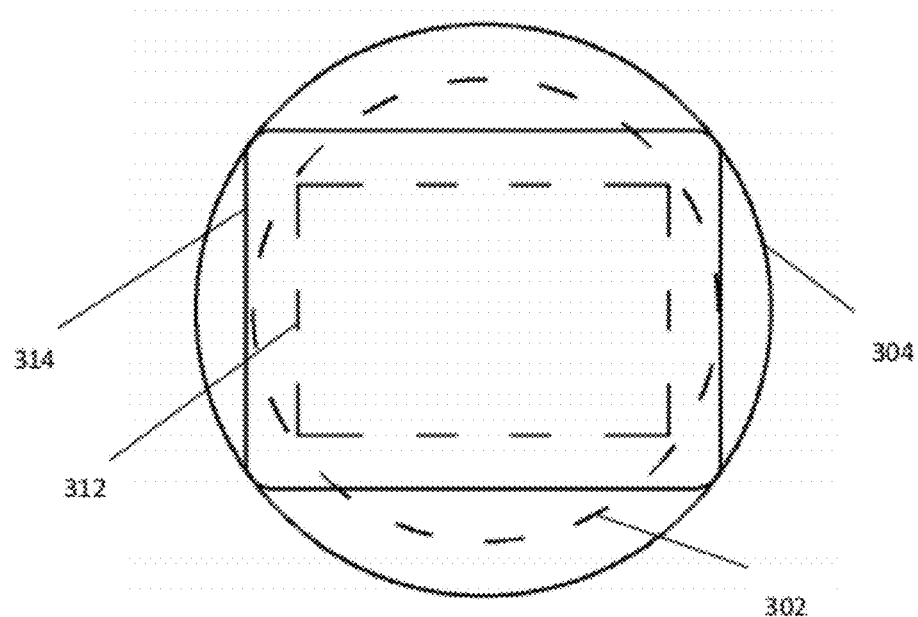
FIG. 3 illustrates the difference in detection area covered by a pinhole-based collimator and a collimator according to embodiments of the present invention.

A major advantage of collimators according to embodiments of the present invention is the difference in the zone of the detector that is irradiated. As indicated above, the collimators according to embodiments of the present invention can advantageously be used in combination with non-circular detector elements or if multiple hole collimators are used. This is visualized in FIG. 3. FIG. 3 illustrates the sensitivity profile for a pinhole collimator on the one hand and a collimator according to an embodiment of the present invention on the other hand. Collimators typically result in two detection regions or detection zones. In a first sensitive zone, referred to as high-sensitivity zone, the majority of the detections will be performed, whereas some detections also may occur outside this zone, i.e. in a zone referred to as low-sensitive zone (also known as the penumbra). In the high sensitivity zone, the incident radiation may come from radiation passing the aperture at any position of the aperture, in the low sensitivity zone, the incident radiation can only come from part of the aperture. Both irradiation zones are illustrated for a pinhole collimator and a collimator according to embodiments of the present invention for a flood source held above the collimator. For the pinhole collimator, the area within the elliptical shape 302 is the high-sensitive detection zone, whereas the area between elliptical shape 304 and elliptical shape 302 is the low sensitivity detection zone. Outside curve 304, no detection of geometrical photons occurs. For the collimator according to embodiments of the present invention, the zone within the substantially polygonal shape 312 is the high sensitivity zone, whereas the zone between the substantially polygonal shape 314 and the polygonal shape 312 is the low sensitivity zone. Outside the substantially polygonal shape 314, no detections occur.

By way of illustration, embodiments of the present invention not being limited thereto, a number of examples of embodiments of the present invention is provided below, indicating some standard and optional features and advantages of embodiments of the present invention.

Figure 4A:
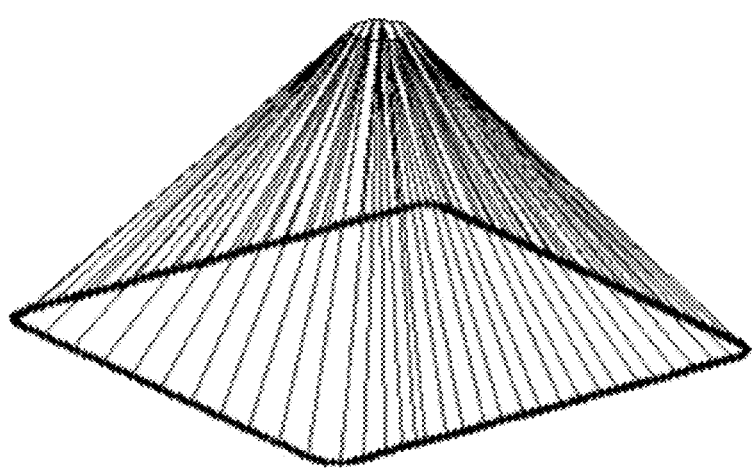
FIG. 4a and FIG. 4b illustrate a side view and a top view of a bottom volume of an example of a collimator according to an embodiment of the present invention.
Figure 4B:
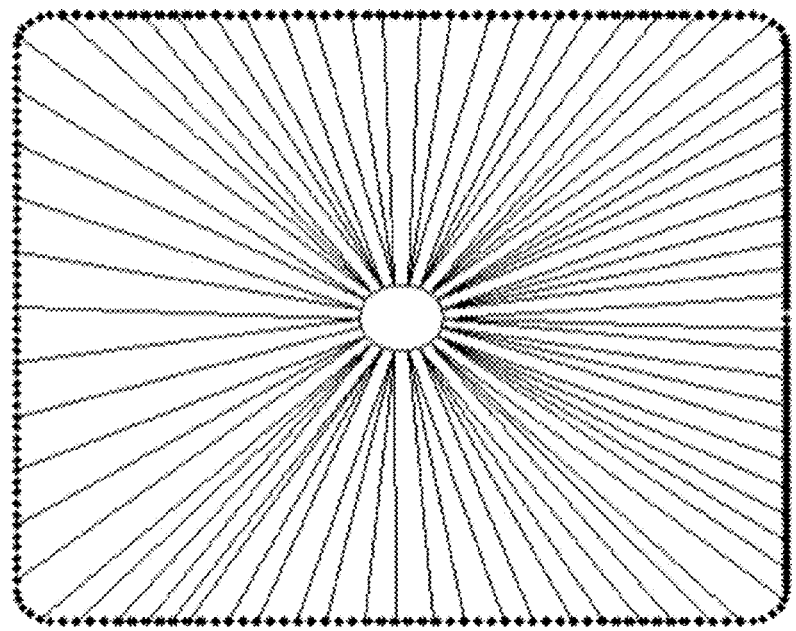
Figure 5:
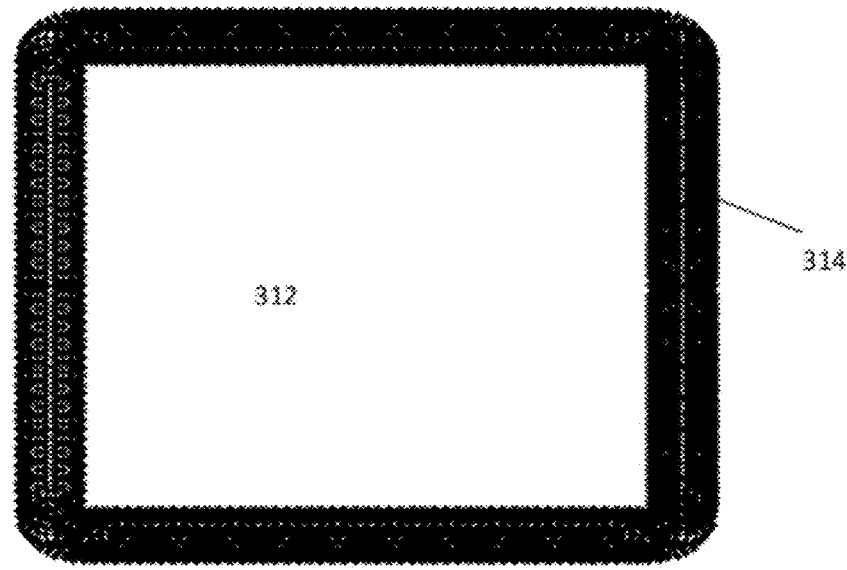

A first particular example illustrates a collimator according to an embodiment of the present invention. The example shown in FIG. 4a and FIG. 4b illustrates a non-conical volume of the collimator at one side of the aperture, respectively in side view and in top view. The top side of the exemplary collimator has a conical shape. The collimator according to the present example results in a sensitivity region that is substantially polygonal shaped, as indicated in FIG. 5 by shapes 312 and 314 indicating a high-sensitivity and low-sensitivity region respectively. The collimator according to the first example is adapted to have a rectangular high sensitivity area, whereas the low sensitivity area is still polygonal in shape having rounded corners.

Figure 6A:
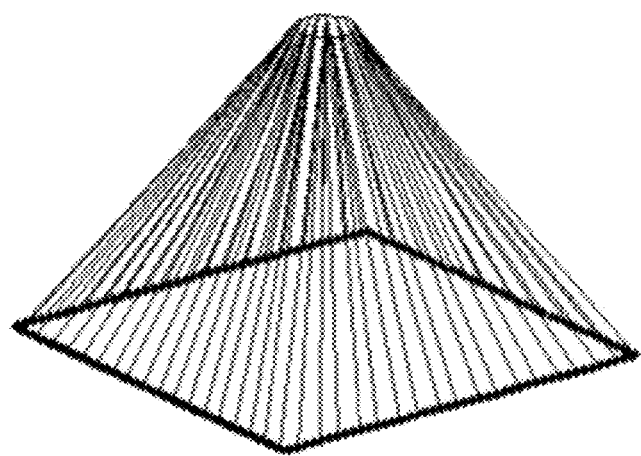
FIG. 6a and FIG. 6b illustrate a side view and a top view of a bottom volume of another example of a collimator according to an embodiment of the present invention.
Figure 6B:
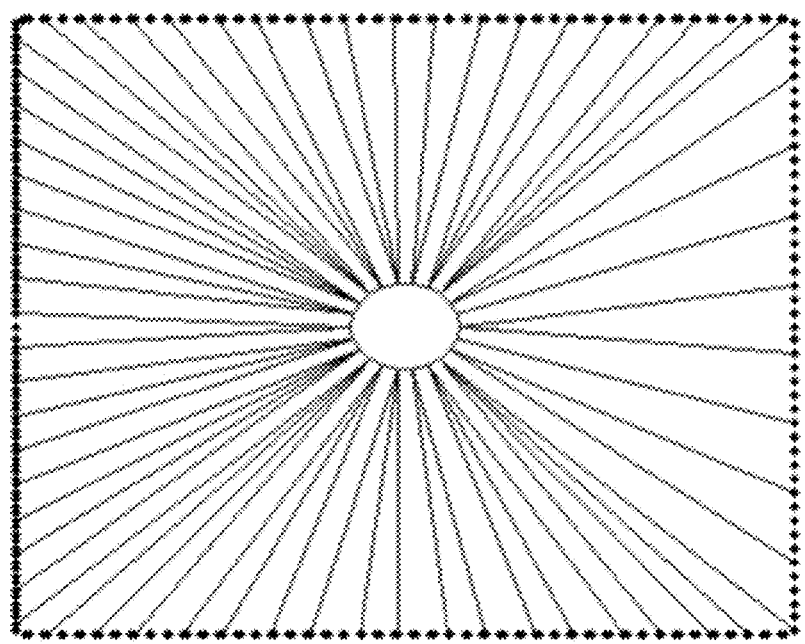
Figure 7:
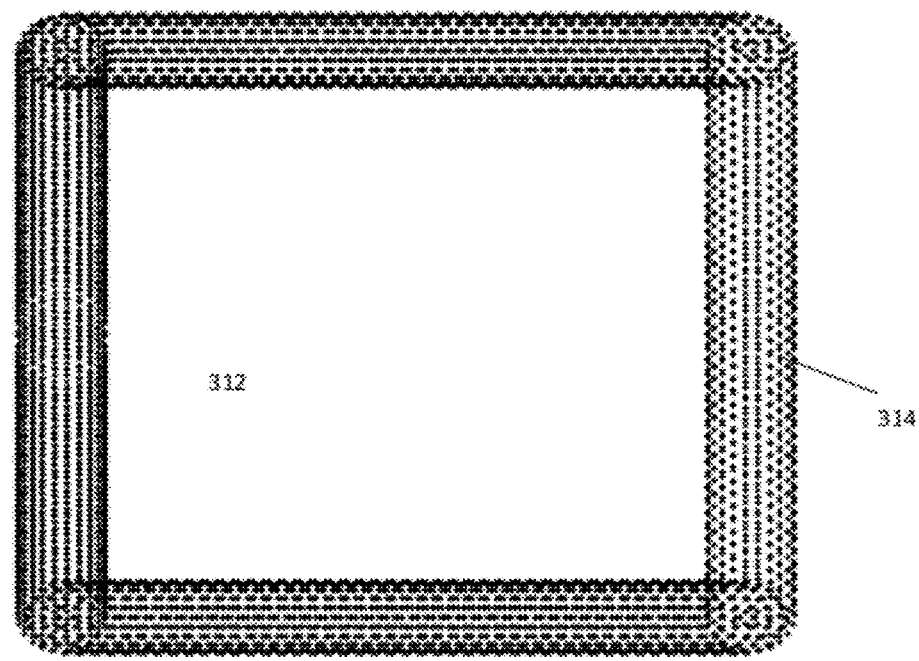

A second particular example illustrates a collimator as described in the first example, but wherein the collimator is shaped such that the low sensitive area has an as much rectangular shape as possible, whereas the high sensitivity area is rectangular. By way of illustration, FIG. 6a and FIG. 6b illustrate the non-conical volume of the collimator at one side of the aperture, respectively in side view and top view. The top side of the exemplary collimator again is conical, although embodiments of the present invention are not limited thereto. The collimator according to the second particular example results in a sensitivity region that is substantially polygonal shaped, as indicated in FIG. 7 by shapes 312 and 314 indicating a high-sensitivity and low-sensitivity region respectively.

Figure 8A:
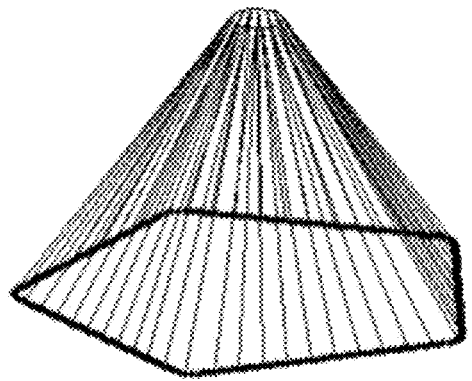
FIG. 8a and FIG. 8b illustrate a side view and a top view of a bottom volume of yet another example of a collimator according to an embodiment of the present invention.
Figure 8B:
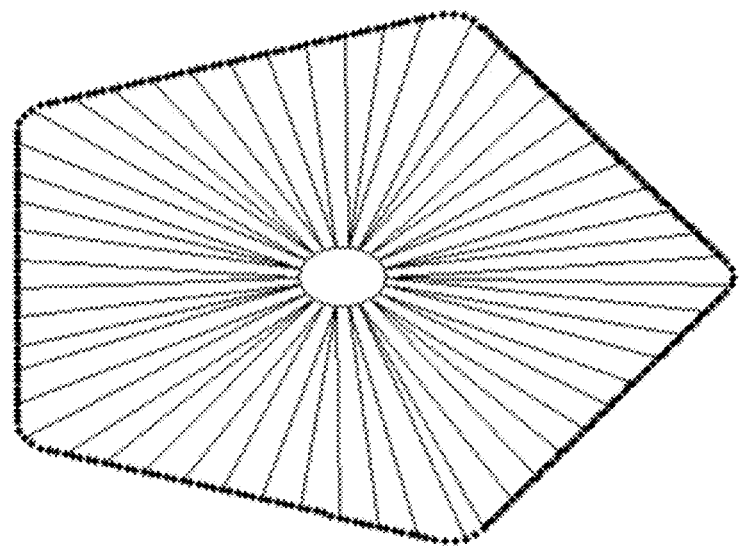
Figure 9:
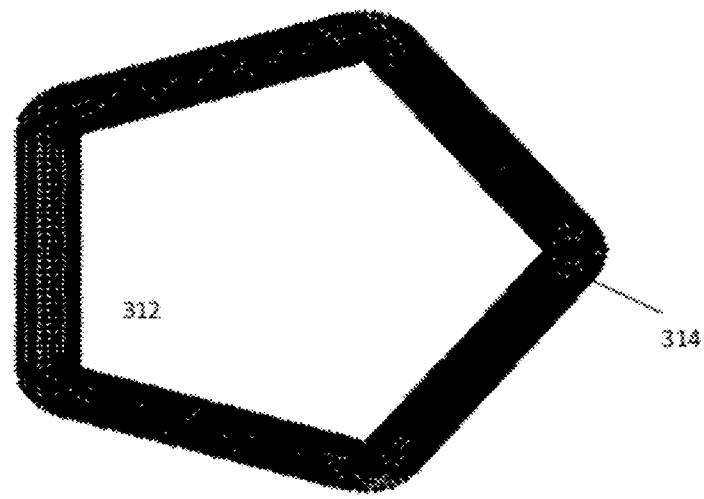

A third particular example illustrates a collimator according to an embodiment of the present invention, wherein the collimator is shaped such that the high sensitive area has a pentagonal shape. The low sensitivity area also is still polygonal in shape with rounded corners. By way of illustration, FIG. 8a and FIG. 8b illustrate the non-conical volume of the collimator at one side of the aperture, respectively in side view and top view. The top side of the exemplary collimator again is conical, although embodiments of the present invention are not limited thereto. The sensitivity regions of this collimator are indicated by the shapes 312 and 314 in FIG. 9, indicating a high-sensitivity and low-sensitivity region respectively.

Figure 10A:
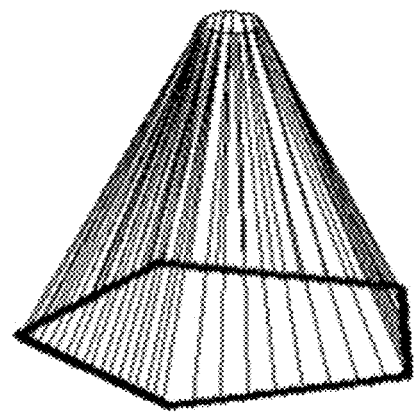
FIG. 10a and FIG. 10b illustrate a side view and a top view of a bottom volume of still another example of a collimator according to an embodiment of the present invention.
Figure 10B:
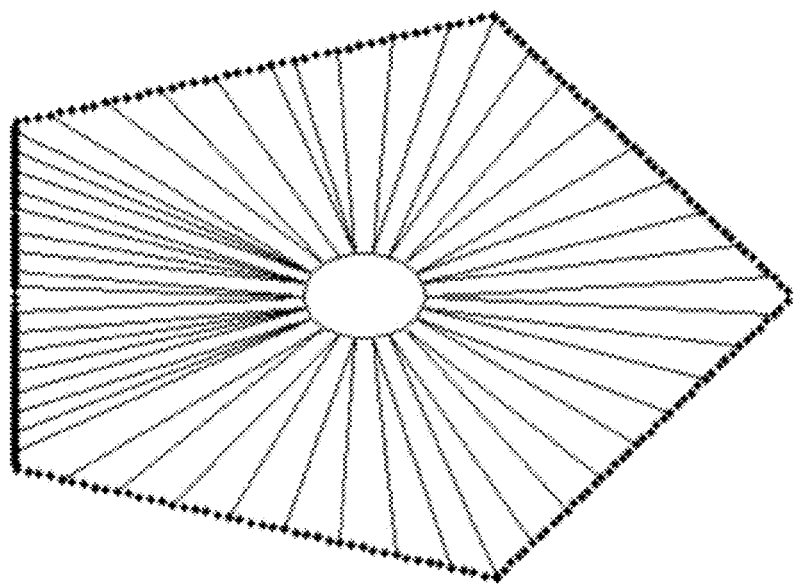
Figure 11:
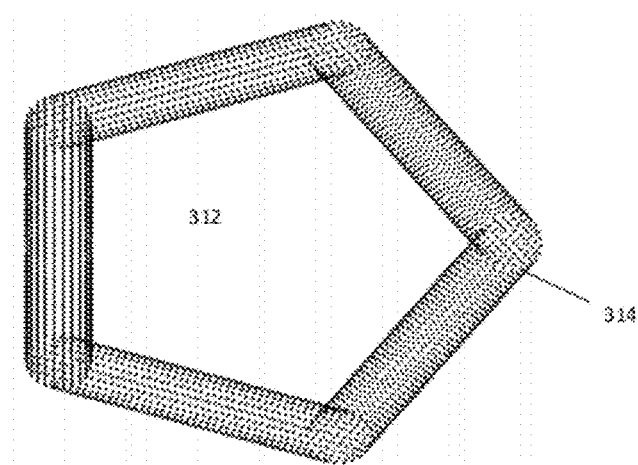

A fourth particular example illustrates a collimator according to an embodiment of the present invention. The example shown in FIG. 10a and FIG. 10b illustrates a non-conical volume of the collimator at one side of the aperture, respectively in side view and in top view. The top side of the exemplary collimator has a conical shape. The collimator according to the present example results in a sensitivity region that is pentagonal shaped, as indicated in FIG. 11 by shapes 312 and 314 indicating a high-sensitivity and low-sensitivity region respectively. This collimator is designed in such a way that a pentagonal detector is used as area-efficient as possible without radiating outside the pentagonal detector, its low sensitivity area is shaped as pentagonal as possible. The resulting low sensitivity area is a pentagon with rounded corners.

Figure 12:
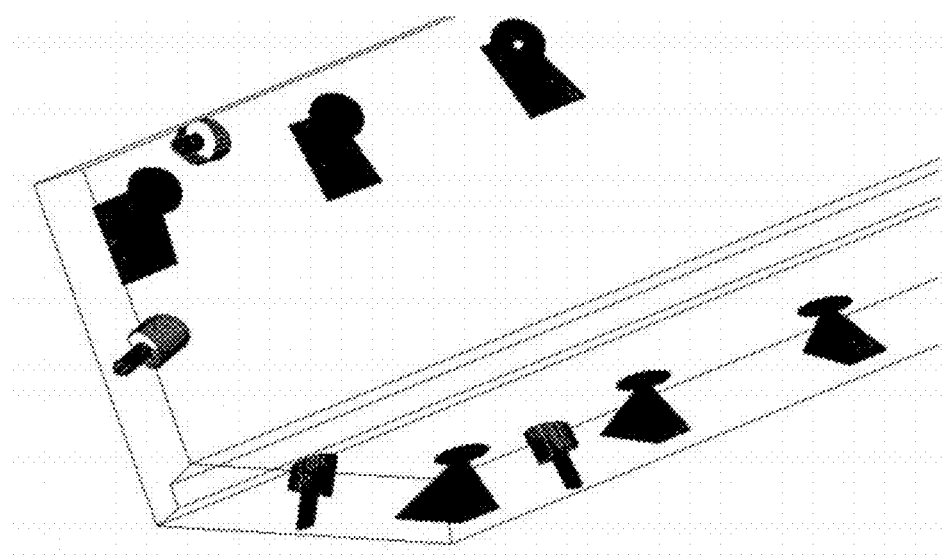
FIG. 12 illustrates a top side view of a collimator comprising a plurality of holes according to an embodiment of the present invention.
Figure 13:
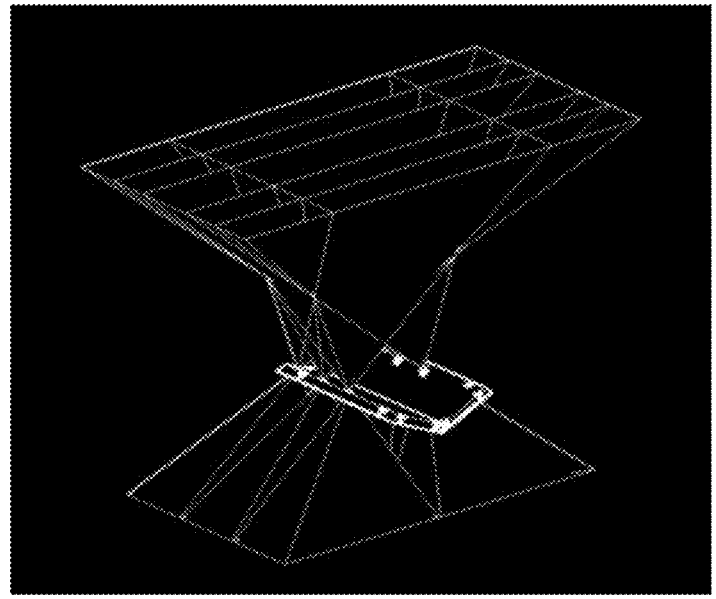
FIG. 13 illustrates the detector irradiation and the field of view using a collimator as described in FIG. 12.

Further by way of illustration, FIG. 12 illustrate a front side view of a collimator with plurality of holes. In the present example, the collimator holes have a complex volume at one side of the aperture, defined by the aperture and rectangular shaped exit surfaces for the collimator holes. FIG. 13 illustrates an example of detector irradiation and field of view an exemplary collimator as indicated in FIG. 12.

Figure 14:
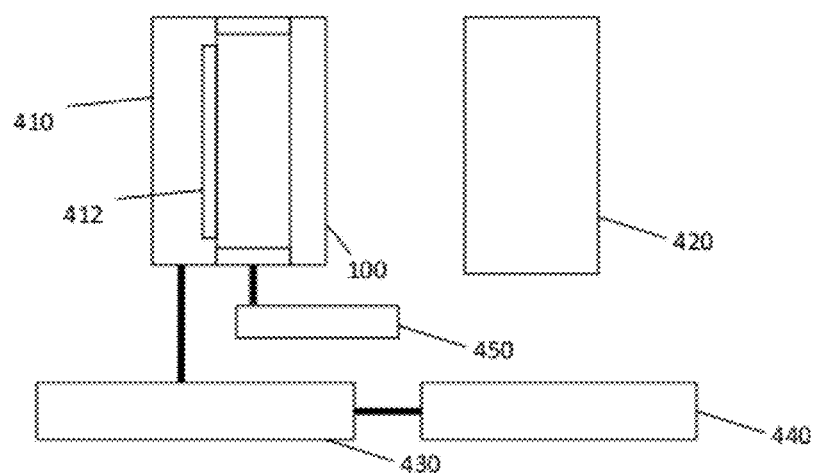
FIG. 14 illustrates a radiation-related system comprising a collimator according to an embodiment of the present invention.

In one aspect, the present invention also relates to a radiation-related system, such as for example a detection system comprising at least one collimator as described in one of the embodiments above. The system may for example be a SPECT system, although embodiments of the present invention are not limited thereto. The system could for example also be a detection system comprising a camera such as a CCD camera, which is adapted to be irradiated with visible light using several collimator apertures. Applications also can be found for example in astrophysics. The system may for example comprise, besides a collimator according to one of the embodiments as described above or examples described below, a detection surface with a predetermined area. It is an advantage of such systems that the collimator may be adapted to make optimum use of the predetermined area of the detection surface. The collimator according to embodiments of the present invention can advantageously be used in several systems. The detection surface typically is the surface of a detector, which also may be part of the radiation-related system. The radiation-related system furthermore may typically comprise driving circuitry for driving the detector. It optionally also may comprise a processor for capturing the obtained detection results and a positioning and alignment system for positioning the collimator with respect to the detector and/or the radiation source. Standard and optional components of the radiation-related system 400 are illustrated in FIG. 14, indicating a collimator 100, a detector 410 with detection surface 412, a radiation emitting object 420 that may not be part of the system driving circuitry 430, a processor 440 e.g. embedded in a computer and a positioning and alignment system 450. Other components, which typically may be present in radiation-related systems known by persons skilled in the art, also may be present in embodiments of the present invention.

By way of illustration, embodiments of the present invention not being limited thereto, some particular examples for SPECT scanner architectures are given below as examples of the radiation-related systems.

In one particular example, one big gamma detector is radiated using a collimator comprising a plurality of holes. If the collimator designer uses pinholes for this architecture, according to prior art, then the designer must use high slats to divide the detector surface into rectangles in order to avoid overlapping projections or the designer will need to make sure that the projections do not overlap, then not making use of the full detection surface. In the first case he will have to use expensive and heavy shielding material for the slats, in the latter case he will lose valuable detector surface. With a collimator according to embodiments of the present invention, the area of the detection surface not used can be minimized without or without substantially increasing overlap regions. If some small regions of overlap would still exist, the designer has the choice of using slats which can be smaller compared to the slats required when using pinholes, or making sure that projections do not overlap whereby less detector area is lost because the projections are adapted and may for example be nearly rectangular.

In another particular example, a stationary ring of multiple rectangular gamma detectors can be used. With pinholes the designer would need a lot of spacing between the detector elements or he would have to use slats. The collimator according to embodiments of the present invention is more optimized and allows closer packing of the detectors or allows the use of smaller slats.

Collimators according to embodiments of the present invention have the benefit that they require less shielding material. This has an impact on cost and on weight. Weight is an important factor, e.g. in a SPECT system, because most SPECT scanners rotate the detector and collimator around the patient.

In one aspect, the present invention also relates to a method for designing or producing a collimator, e.g. a collimator as described in the first aspect. The method for designing or producing a collimator may be a computer-based method for designing a collimator but optionally also may comprise making the collimator based on the determined design. The method for designing or producing a collimator according to embodiments of the present invention may be a method adapted for taking into account the shape of the detection surface used in the system for which the collimator is designed, so as to improve or optimize the use of the detection surface. It is for example an advantage of some embodiments according to the present invention using a collimator with multiple holes that overlap of regions irradiated through different collimator holes can be minimized, controlled or avoided. The method for designing or producing a collimator may, in an exemplary method, comprise the steps of defining a collimator material, e.g. collimator plate, with an aperture and a a bottom surface and/or top surface of the collimator material, e.g. a surface at the side of the collimator where radiation will be received or a surface at the side of the collimator where radiation will be detected such as for example a bottom side at a position where radiation will need to be coupled out from the collimator, determining the detector area that one wants to irradiate using the collimator, whereby the detector area or part thereof can be any shape such as rectangular, trapezoidal, polygon, etc., drawing construction lines from all corners of this determined detector area towards the aperture and determining the shape of the entrance opening or exit opening to be provided in the collimator by the intersection of these construction lines with the a bottom surface and/or top surface of the collimator plate.

Figure 15:
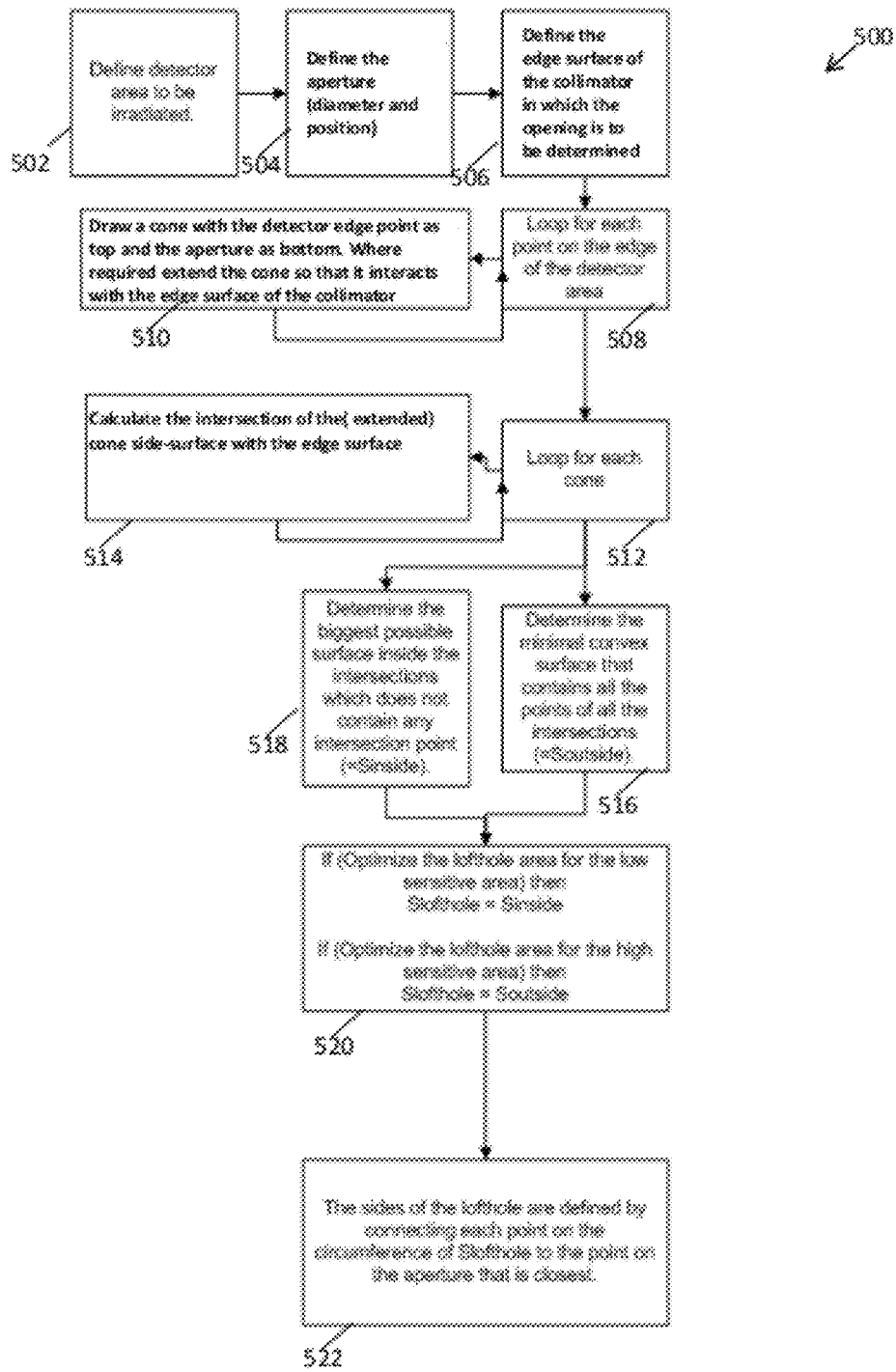
FIG. 15 illustrates an exemplary method for designing a collimator according to an embodiment of the present invention.

By way of illustration, embodiments of the present invention not being limited thereto, an exemplary method for designing or producing a collimator is further discussed below, whereby reference is made to FIG. 15. The method 500 shown in FIG. 15 illustrates standard and optional steps of a method according to an embodiment of the present invention.

The exemplary method 500 comprises defining 502 a detector area or part of the detector area to be irradiated using the collimator. The collimator according to embodiments of the present invention is designed or produced to good or optimally function for a detector having a particular detector shape. The particular detector shape or a particular detector shape thus can be taken into account in embodiments of the present invention.

In step 504, the aperture is defined. The aperture will be the top area or bottom area of the complex volume that will be determined and that forms the upper or lower part of the collimator, depending on whether the upper part, i.e. the part between the radiation source and the aperture, or the lower part, i.e. the part between the aperture and the detector surface, is to be particularly shaped. The aperture typically is the smallest area confining the radiation going through the collimator hole and is positioned in between an entrance side of the collimator hole, positioned at the top surface of the collimator, and an exit side for radiation, being positioned at the bottom surface of the collimator. Defining the aperture may include determining the diameter of the aperture and the position in the collimator. The aperture typically may be circular shaped, although embodiments of the present invention are not limited thereto. The further procedure is described for a circular shaped aperture, but the principle can be mutatis mutandis applied for non-circular shaped apertures. In step 506, a bottom surface and/or top surface, also referred to as the edge surface, of the collimator material is defined. This surface will comprise or define the exit opening respectively entrance opening of the collimator hole in the collimator material, once the collimator has been constructed.

In step 510, for each of a plurality of points 508 on the edge of the detector area to be irradiated using the collimator, a cone is drawn with the detector edge point as apexes and with the edge of the aperture lying on the cone's lateral surfaces.

In step 514, for each of these cones 512, the intersection of the cone with the bottom surface and/or top surface is determined.

In decision step 516, the minimal convex surface that contains all the points of all of the intersections is determined ($S_{outside}$). In decision step 520 this minimal convex surface is defined as the edge portion of the hole in the bottom surface and/or top surface through which radiation will be received or transmitted, when the collimator hole is optimized for the high sensitivity area of the detector. By selecting $S_{outside}$ as the hole in the bottom surface and/or top surface, the edge of the detector area can be reached by radiation from each point of the aperture.

In step 518, the biggest possible surface inside the intersections is determined that does not contain an intersection point ($S_{inside}$). In decision step 520, this biggest possible surface is chosen as the edge portion of the hole in the bottom surface and/or top surface through which radiation is received or transmitted, when the collimator hole is optimized for the low sensitivity area of the detector. When using $S_{inside}$ as the hole in the bottom surface and/or the top surface through which radiation is received or transmitted, none of the geometric radiation can fall outside the detector area. In step 522, the other walls of the collimator hole, i.e. the walls between the aperture and the a bottom surface and/or top surface, may be determined by connecting each point of the circumference of the surface determined in steps 516 or 518 to the point on the aperture that is closest.

The volume of the collimator hole between the aperture and the remaining top surface or bottom surface of the collimator, may be determined in a similar way or may be selected such that it does not stop any ray that can pass the complex volume of the collimator hole at the other side of the aperture. This volume may for example be shaped as a cone or as a complex volume similar to the one used for the bottom and/or top volume of the collimator.

In a further step (not shown), based on the design, the collimator can be manufactured. The latter may for example be performed for example by casting material in moulds based on the design or for example by machining, such as for example milling or electrical discharge machining. The manufacturing technique may be selected based on the material used. Casting can for example be used when using tungsten, lead, platinum or gold, milling can typically be used for lead and tungsten alloys, electrical discharge machining can typically be used for tungsten.

Figure 16:
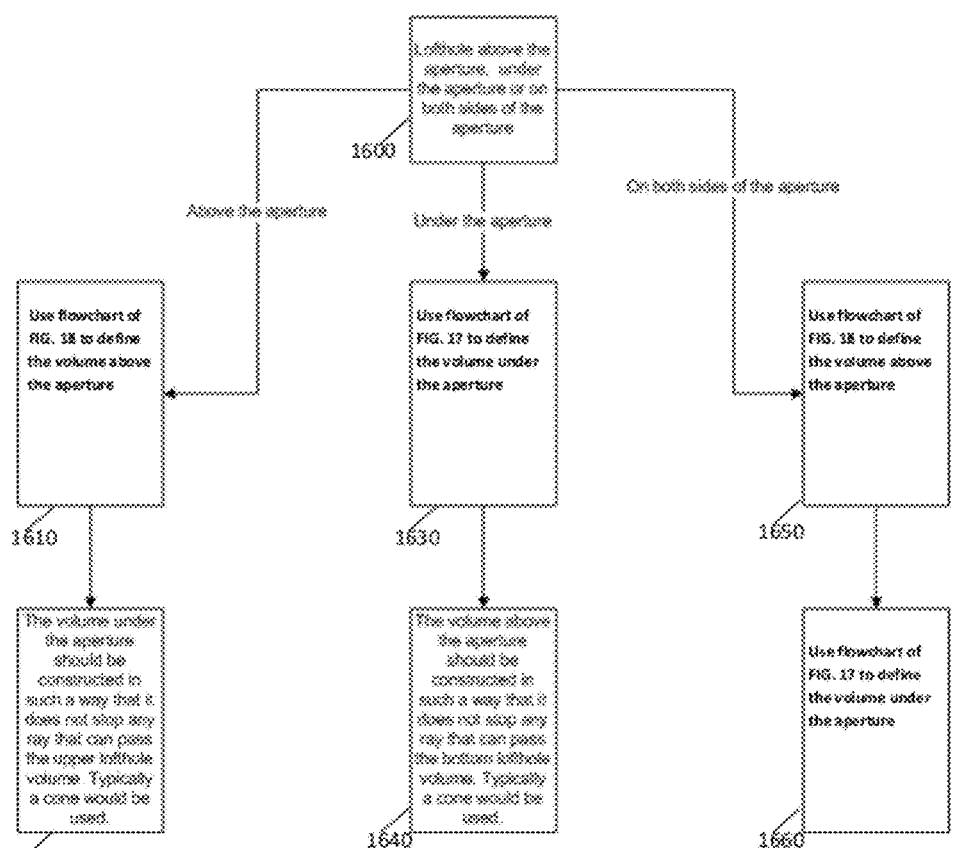
FIG. 16 illustrates an exemplary method for designing a lofthole collimator, whereby possibilities are provided for designing an upper portion of the collimator volume as a lofthole, a lower portion of the collimator volume as a lofthole or both an upper and lower portion of the collimator volume as a lofthole, according to an embodiment of the present invention.

By way of illustration, FIG. 16 describes a decision process 1600 for designing a collimator hole wherein the collimator hole is specially shaped between for its portion lying between the aperture and the side from which the radiation will be received, for its portion lying between the aperture and the side from which the radiation will be coupled out, or for a combination of these portions.

Figure 18:
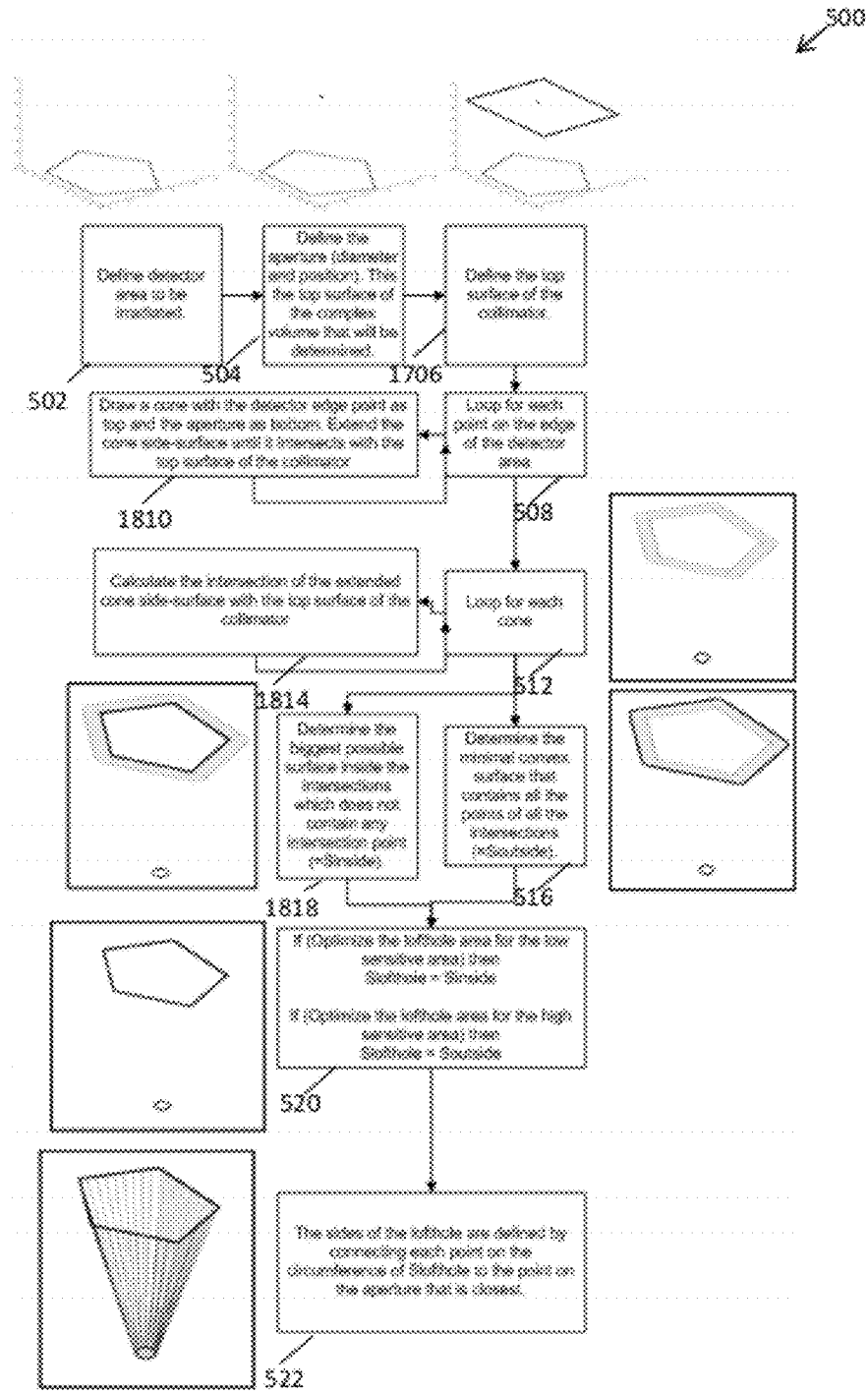
FIG. 18 illustrates an exemplary method for designing an upper portion (being the portion of the collimator between the radiation source and the aperture) of a collimator as a lofthole, according to an embodiment of the present invention.

In the first optimization, the process as shown in FIG. 18 for defining 1610 the specially shaped volume for the portion lying between the aperture and the side from which the radiation will be coupled in is applied, whereby the volume of the other portion of the hole is designed 1620 and optionally constructed in such a way that it does not stop any rays that can pass the specially shaped volume. Typically a cone may be used.

Figure 17:
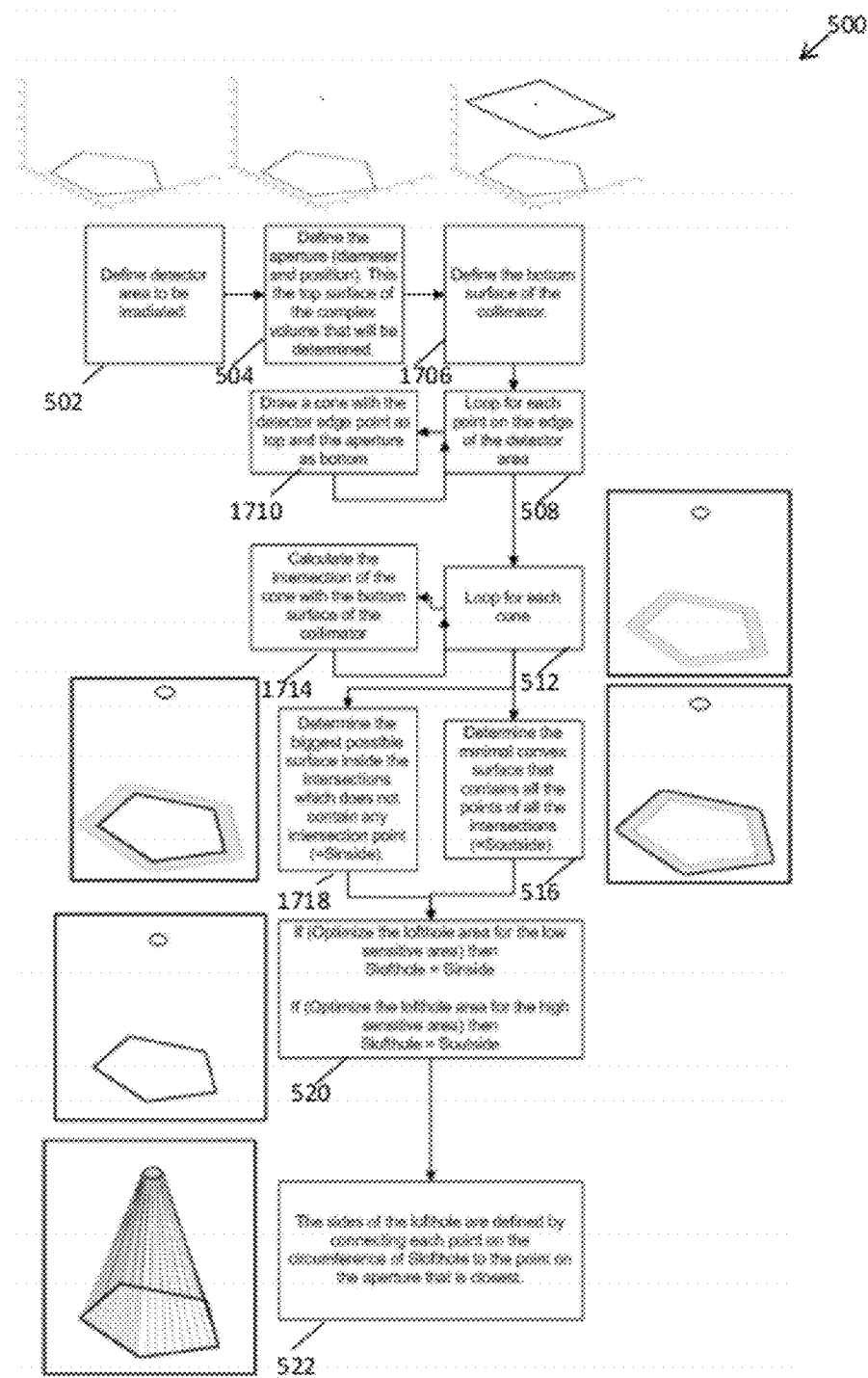
FIG. 17 illustrates an exemplary method for designing a lower portion (being the portion of the collimator between the aperture and the detector surface) of a collimator as a lofthole, according to an embodiment of the present invention.

In the second optimization, the process as shown in FIG. 17 for defining 1630 the specially shaped volume for the portion lying between the aperture and the side at which the radiation will be detected is applied, whereby the volume of the other portion of the hole is designed and optionally also constructed 1640 such that it does not stop any ray that can pass the specially shaped volume. For this other portion, typically a cone may be used.

In case optimization is required of wanted at both sides of the aperture, a process as indicated in FIG. 18 for defining 1650 the specially shaped volume for the portion lying between the aperture and the side from which the radiation will be received is applied and a process as indicated in FIG. 17 for defining 1660 the specially shaped volume for the portion lying between the aperture and the side at which the radiation will be detected is applied.

The processes shown in FIG. 17 and FIG. 18 describe a process for designing as described in FIG. 15, whereby FIG. 17 specifies determination of the shape of the portion of the collimator hole between the aperture and the side where detection will be done, whereas FIG. 18 specifies determination of the shape of the portion of the collimator hole between the aperture and the side where the radiation will be received. FIG. 17 thereby specifies that the a bottom surface and/or top surface of the collimator material discussed in step 506 will be the bottom surface of the collimator, i.e. the surface between the aperture and the side of the collimator at which detection will be performed, as indicated in current step 1706, that the cones to be formed corresponding to step 510 (currently indicated as step 1710) are formed using a detector edge point as apex (top) and an aperture as bottom, and that the surface to be determined corresponding to step 514 (currently indicated as step 1714) is based on determining the intersection of the cone with the bottom surface of the collimator. FIG. 18 thereby specifies that the a bottom surface and/or top surface of the collimator material discussed in step 506 will be the top surface of the collimator, i.e. the surface between the aperture and the side of the collimator at which radiation is received, as indicated in current step 1806, that the cones to be formed corresponding to step 510 (currently indicated as step 1710) are formed using a detector edge point as apex and the aperture lying on the cone's lateral surface, whereby the cone walls are extended until they intersect with the top surface of the collimator, and that the surface to be determined corresponding to step 514 (currently indicated as step 1714) is based on determining the intersection of the cone with the top surface of the collimator. Whereas the above embodiments have been described for a single hole collimator, the methods are equally applicable to collimators having a plurality of holes. In case a collimator is used with a plurality of holes, the detector area can be divided in a plurality of parts of the detector areas, e.g. a plurality of adjacent polygonal shaped areas such as for example a plurality of adjacent rectangular shaped areas, and e.g. the above method can be repeated for each collimator hole used for irradiating a particular part of the detector area.

Figure 19:
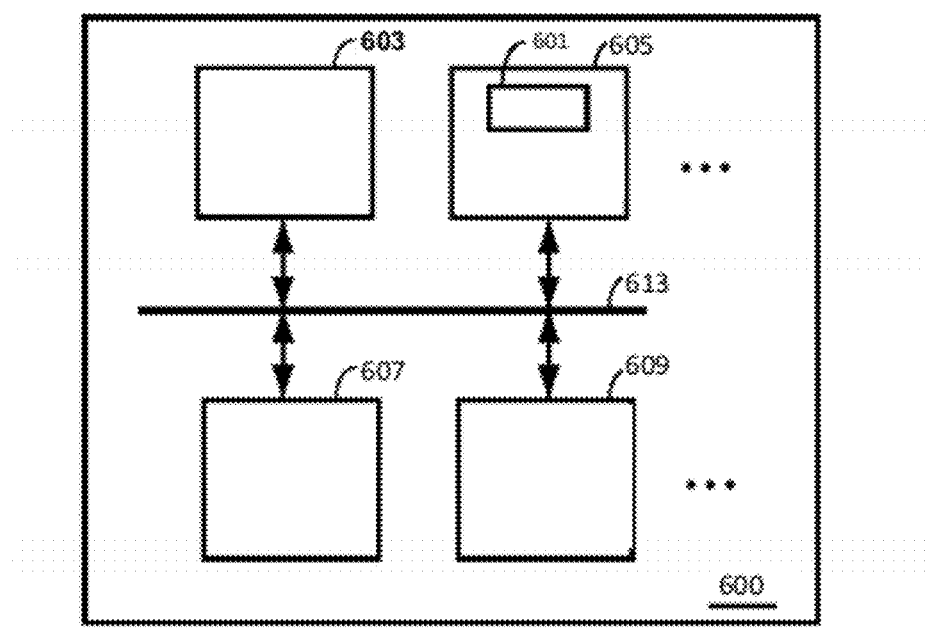
FIG. 19 illustrates a schematic representation of a computing system that may be used for performing a method according to an embodiment of the present invention.

In one aspect, embodiments of the present invention also relate to computer-implemented methods for performing a method for designing and/or producing a collimator as described above. FIG. 19 shows one configuration of a processing system 600 that includes at least one programmable processor 603 coupled to a memory subsystem 605 that includes at least one form of memory, e.g., RAM, ROM, and so forth. It is to be noted that the processor 603 or processors may be a general purpose, or a special purpose processor, and may be for inclusion in a device, e.g., a chip that has other components that perform other functions. Thus, one or more aspects of embodiments of the present invention can be implemented in digital electronic circuitry, or in computer hardware, firmware, software, or in combinations of them. The processor may be adapted for performing a method for designing or manufacturing a collimator or may comprise instructions for performing a method for designing or manufacturing a collimator. The processing system may include a storage subsystem 607 that has at least one disk drive and/or CD-ROM drive and/or DVD drive. In some implementations, a display system, a keyboard, and a pointing device may be included as part of a user interface subsystem 609 to provide for a user to manually input information. Ports for inputting and outputting data also may be included. More elements such as network connections, interfaces to various devices, and so forth, may be included, but are not illustrated in FIG. 16. The various elements of the processing system 600 may be coupled in various ways, including via a bus subsystem 613 shown in FIG. 16 for simplicity as a single bus, but will be understood to those in the art to include a system of at least one bus. The memory of the memory subsystem 605 may at some time hold part or all (in either case shown as 611) of a set of instructions that when executed on the processing system 600 implement the steps of the method embodiments described herein. More particularly, the memory may comprise instructions for defining a collimator material, e.g. collimator plate, with an aperture and a a bottom surface and/or top surface of the collimator material, e.g. a surface at the side of the collimator where radiation will be received or a surface at the side of the collimator where radiation will be detected such as for example a bottom side at which the radiation will be coupled out from the collimator, determining the detector area or part thereof that one wants to irradiate using the collimator hole whereby the detector area or part thereof can be any shape such as rectangular, trapezoidal, polygon, etc., drawing construction lines from all corners of this determined detector area towards the aperture and determining the shape of the entrance opening or exit opening to be provided in the collimator by the intersection of these construction lines with a a bottom surface and/or top surface of the collimator plate. Thus, while a processing system 200 such as shown in FIG. 16 as such is prior art, a system that includes the instructions to implement aspects of the methods for designing and/or producing a collimator is not prior art, and therefore FIG. 16 is not labeled as prior art.

The present invention also includes a computer program product which provides the functionality of any of the methods according to the present invention when executed on a computing device. Such computer program product can be tangibly embodied in a carrier medium carrying machine-readable code for execution by a programmable processor. The present invention thus relates to a carrier medium carrying a computer program product that, when executed on computing means, provides instructions for executing designing a collimator according to any of the methods as described above. The term "carrier medium" refers to any medium that participates in providing instructions to a processor for execution. Such a medium may take many forms, including but not limited to, non-volatile media, and transmission media. Non volatile media includes, for example, optical or magnetic disks, such as a storage device which is part of mass storage. Common forms of computer readable media include, a CD-ROM, a DVD, a flexible disk or floppy disk, a tape, a memory chip or cartridge or any other medium from which a computer can read. Various forms of computer readable media may be involved in carrying one or more sequences of one or more instructions to a processor for execution. The computer program product can also be transmitted via a carrier wave in a network, such as a LAN, a WAN or the Internet. Transmission media can take the form of acoustic or light waves, such as those generated during radio wave and infrared data communications. Transmission media include coaxial cables, copper wire and fibre optics, including the wires that comprise a bus within a computer.

While the invention has been illustrated and described in detail in the drawings and foregoing description, such illustration and description are to be considered illustrative or exemplary and not restrictive. The invention is not limited to the disclosed embodiments.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

The invention claimed is:

1. A collimator for collimating radiation, the collimator comprising:
   collimator material and at least one collimator hole defined by the surrounding collimator material,
   the collimator hole defining an aperture, and an entrance opening and exit opening through which radiation can enter respectively leave the collimator,
   wherein the volume of the collimator hole between the aperture and the entrance opening and/or exit opening is shaped such that there is at least one cross-section of the hole between the aperture and the entrance opening and/or exit opening, the cross-section being taken parallel with the aperture, and the shape of the cross-section of the hole being a non-affine transform of the shape of the aperture.

2. The collimator according to claim 1, wherein the volume of the collimator hole between the aperture and the entrance and/or exit opening of the collimator hole is limited by the aperture on one side and by a surface area comprising at least one corner at another side.

3. The collimator according to claim 2, wherein the shape of the area defined by the entrance opening and/or exit opening of the collimator hole is polygonal.

4. The collimator according to claim 2, wherein the shape of the area of the entrance opening and/or exit opening of the collimator hole is rectangular.

5. The collimator according to claim 1, wherein the collimator comprises a plurality of collimator holes.

6. The collimator according to of claim 1, embedded in a radiation detection system.

7. A radiation detection system comprising a detector having a non-circular shaped detection area and the collimator recited in claim 1.

8. A collimator for collimating radiation, the collimator comprising:
   collimator material and at least one collimator hole defined by the surrounding collimator material,
   the collimator hole defining an aperture, and an entrance opening and an exit opening through which radiation can enter respectively leave the collimator,
   wherein a volume of the collimator hole between the aperture and the entrance opening and/or the exit opening is shaped such that there is at least one cross-section of the hole between the aperture and the entrance opening and/or the exit opening, the cross-section being taken parallel with the aperture, and the shape of the cross-section of the hole being a non-affine transform of the shape of the aperture, and wherein the collimator is configured to operate with a detector having a non-circular shaped detection area, wherein the volume of the collimator hole between the aperture and the exit opening is determined from the shape of the detection area and/or wherein the volume of the collimator hole between the aperture and the entrance opening is determined from the shape of the detection area.

9. The collimator according to claim 8, the collimator comprising a plurality of collimator holes, wherein the plurality of collimator holes are arranged for irradiating different parts of the detection area surface, the different parts filling the detector area overall for at least 80% and the different areas overlapping with each other over at most 20% of their total surface.

10. A method for designing or producing a collimator comprising:
 defining a collimator material and at least one collimator hole defined by the surrounding collimator material, wherein said at least one collimator hole defines an aperture, and an entrance and an exit opening through which radiation can enter and leave the collimator, respectively,
 shaping a volume of the at least one collimator hole between the aperture and the entrance opening and/or the exit opening such that there is at least one cross-section of the hole between the aperture and the entrance opening and/or the exit opening, the cross-section being taken parallel with the aperture, and the shape of the cross-section of the hole being a non-affine transform of the shape of the aperture, and
 determining a detection area or part thereof for irradiating using the collimator,
 wherein the collimator is configured to operate with a detector having a non-circular shaped detection area, and wherein the volume of the at least one collimator hole between the aperture and the exit opening is determined from a shape of the detection area and/or wherein the volume of the collimator hole between the aperture and the entrance opening is determined from a shape of the detection area.

11. A non-temporary computer program product comprising code, which when the program is executed on a computer, performs the designing or producing the collimator recited in claim 10.

12. A non-temporary machine readable data storage device comprising instructions for implementation on a digital computer for the designing or producing the collimator recited in claim 10.

* * * * *